United States Patent [19]
Lee et al.

[11] Patent Number: 5,466,628
[45] Date of Patent: Nov. 14, 1995

[54] METHOD OF MANUFACTURING TRENCH CAPACITOR WITH A RECESSED FIELD OXIDE LAYER

[75] Inventors: Joo-young Lee, Kwacheon; Kyu-pil Lee, Suwon, both of Rep. of Korea

[73] Assignee: Samsung Electronics Co, Ltd., Suwon, Rep. of Korea

[21] Appl. No.: 272,528

[22] Filed: Jul. 11, 1994

Related U.S. Application Data

[62] Division of Ser. No. 33,721, Mar. 18, 1993, abandoned.

[30] Foreign Application Priority Data

Mar. 19, 1992 [KR] Rep. of Korea ............... 92-4560

[51] Int. Cl.$^6$ ................................ H01L 21/8242
[52] U.S. Cl. .................. 437/60; 437/203; 437/919
[58] Field of Search .................. 437/47, 60, 203, 437/919; 148/DIG. 14, DIG. 50

[56] References Cited

U.S. PATENT DOCUMENTS 4,734,384   3/1988   Tsuchiya ................... 437/60

OTHER PUBLICATIONS

IBM TDB, vol. 27, No. 11, Apr. 1985, pp. 6694–6697.
IBM TDB, vol. 28, No. 6, Nov. 1985, pp. 2578–2579.

*Primary Examiner*—Chandra Chaudhari
*Attorney, Agent, or Firm*—Robert A. Westerlund; Stephen R. Whitt; Charles R. Donohoe

[57] ABSTRACT

A capacitor of a semiconductor device has a plate electrode which process margin and a method of manufacturing same are disclosed. The plate electrode has a planarized surface and borders a source region. A recessed field oxide layer defining an active region is formed on a semiconductor substrate. Then, an insulating pattern for self-aligning an electrode is formed on the active region. The insulating pattern has a step with respect to the field oxide layer. Thereafter, a trench is formed in the semiconductor substrate by partially removing the field oxide layer, the insulating pattern and a surface portion of the semiconductor substrate. A conductive material is deposited on the semiconductor substrate having the trench and the insulating pattern to form a conductive layer filling the trench. Then, the conductive layer is polished until the insulating pattern is exposed, to thereby obtain an electrode having a planarized surface. The plate electrode does not unnecessarily occupy space of the active region and the plate electrode bordering the active region can be formed by self-alignment with a step between the insulating pattern and the field oxide layer. Therefore, sufficient process margin is provided to generate high yields, and a highly integrated semiconductor device having an AST cell can be realized.

29 Claims, 5 Drawing Sheets

METHOD OF MANUFACTURING TRENCH CAPACITOR WITH A RECESSED FIELD OXIDE LAYER

This is a division of application Ser. No. 08/033,721, now abandoned, filed Mar. 18, 1993.

BACKGROUND OF THE INVENTION

The present invention relates to a semiconductor memory device and a manufacturing method therefor, and more particularly to a large-scale-integrated semiconductor memory device having a capacitor and the manufacturing method therefor.

Recently, as semiconductor manufacturing technology has progressed and the field of application of memory elements has expanded, high storage capacity integrated memory devices have been developed. More particularly, memory cells for dynamic random access memories (DRAMs) consisting of only a capacitor and transistor has promoted large-scale integration of memories.

The density of each new generation of DRAMs has increased by a factor of four with a new generation being developed every three years. Thus, the 4 MB DRAM chip is now in mass-production, the 16 MB DRAM has been designed and is quickly being developed for mass production, and both the 64 MB and 256 MB DRAMs are being researched and developed.

Although the memory cells of such semiconductor memory devices should have sufficiently large capacitances to permit storage, reading and writing of information, the tour-fold increase of density or memory capacity has in practice resulted in only a 40% increase in the effective chip area. Thus the stage of the next generation memory cell is reduced to about one-third the size of the previous generation. Therefore, conventional capacitor designs are proving insufficient to provide adequate cell capacitance because of the smaller areas allotted for the capacitors in succeeding generations of DRAMs. Accordingly, methods have been sought to achieve larger capacitances within a given cell area.

To realize memory devices with integration densities beyond that of 64 MB DRAMs, a novel structure is required to guarantee enough capacitance in an area of 1.5 $\mu m^2$ or less. To achieve such a structure, attempts are being made to manufacture a more minute memory cell using the conventional trench capacitor used in 4 MB and 16 MB DRAMs. The biggest problem confronting these attempts is related to the leakage current between the memory cells caused by miniaturization of the memory cell. This leakage current has, for the most part, two paths; one between neighboring trenches, and the other between a storage electrode and its neighboring active region.

Of these two, the leakage current between neighboring trenches can be prevented by the buried-stacked capacitor cell (BSCC) structure, wherein a leakage-current-preventing oxide film is formed before forming the storage electrode inside the trench. However, the problem of leakage current through the contact portion between the storage electrode and its neighboring active region, caused by the impurity diffusion from the contact portion, is not yet solved. This hinders the miniaturization of the memory cell.

A new memory cell which can prevent the above leakage current and which is applicable to 64 MB or higher DRAMs has been suggested by Toshiba Co., Ltd. (see "Process Integration for 64 M DRAM using an Asymmetrical Stacked Trench Capacitor (AST) Cell" by K. Sunouchi et al. IEDM 90, pp. 647–650).

FIG. 1 is a schematic layout for a conventional trench cell, and FIG. 2 is a schematic layout for the aforementioned Toshiba AST cell.

Comparing FIG. 1 with FIG. 2, in the trench cell shown in FIG. 1, trench capacitor T1 is symmetrically arranged with respect to active region D1, while in the AST cell shown in FIG. 2, trench capacitor T1 is asymmetrically arranged with respect to active region D1. Additionally, in the AST cell, the contact portion C1 of a storage electrode used as the capacitor's first electrode is disposed completely within active region D1 and oxide film OX1 is formed on the inner wall of trench capacitor T1, for insulating the trench capacitor from the semiconductor substrate. In FIGS. 1 and 2, reference symbol A denotes the distance between neighboring active regions, B denotes the distance between neighboring trench capacitors, and C denotes the distance between the active region and the trench capacitor. It can be seen that the distance A is the same in FIGS. 1 and 2, while the distances B and C of FIG. 2 are smaller than those of FIG. 1. Since the trench capacitor of an AST cell is asymmetrically arranged, the AST cell has enough distance between the storage electrode's contact portion and its neighboring active region so that leakage current between these two areas can be effectively suppressed. Moreover, the leakage current between neighboring trenches can be prevented by the oxide film OX1 formed on the inner wall of the trench capacitor, thereby realizing memory cell miniaturization.

Therefore, the AST cell can have a larger trench capacitor diameter and hence larger effective surface area regardless of the isolation characteristic of the trench capacitors around it, thereby providing a relatively large storage capacity in a small area.

FIG. 3 is a schematic layout showing a method of manufacturing a conventional semiconductor memory device having a trench cell. The portion defined by the solid line is a mask pattern M1 for forming an active region, the portion defined by the dashed line is a mask pattern P1 for forming a trench capacitor and the portion defined by the dash-dot line is a mask pattern P2 for forming the contact portion. The contact portion connects the transistor's source region with the storage electrode as a first electrode of the trench capacitor. A photoresist pattern is formed on the area except for the portion of the mask pattern P2 for forming the contact portion. Hence, in the subsequent etching step, only the area N is etched to thereby form the contact portion in accordance with pattern P2.

FIGS. 4 to 8 are sectional views of a semiconductor memory device comprising the conventional trench capacitor cell, cut along line a—a' of FIG. 3, and help to explain the method of manufacturing this prior art trench capacitor.

FIG. 4 illustrates a step for forming a trench 10 in the semiconductor substrate 100. First insulating layer 1 and second insulating layer 2 are formed on semiconductor substrate 100 on which field oxide layer 101 has been formed. The first and second insulating layers are formed by sequentially depositing, for example, oxide and nitride layers respectively. Thereafter, second insulating layer 2 is patterned, and then a high temperature oxide (HTO) is deposited over the entire surface area to form third insulating layer 3. Then, a photoresist 4 is coated on third insulating layer 3. Mask pattern P1 for forming the trench capacitor shown in FIG. 3 is applied to form the first photoresist pattern 4 by a conventional exposing and developing process. Then, in sequence the third, second and first insulating layers 3, 2 and 1 and the semiconductor substrate 100 are etched using the first photoresist pattern 4 as an etching mask, to thereby form a trench 10 having a predetermined depth.

FIG. 5 illustrates a step for forming a leakage current preventing layer 11. After removing the first photoresist pattern 4, leakage current preventing layer 11 for preventing leakage current between neighboring trenches is formed on the inner surface of trench 10 by thermally oxidizing the surface portion of semiconductor substrate 100 in trench 10.

FIG. 6 illustrates a step for forming contact portion CA. In order to form contact portion CA for connecting a storage electrode to be formed in the trench 10 with the transistor's source region, a photoresist 5 is coated over the entire surface area after the layer 11 is formed. Then, second photoresist pattern 5 as shown in FIG. 6 is formed by a conventional exposing and developing process, using the mask pattern P2 shown in FIG. 3. Thereafter, a portion of leakage current preventing layer 11 is removed using the second photoresist pattern 5 as a mask, to thereby provide contact portion CA for the storage electrode as a first electrode of the capacitor. According to the above method for forming the contact portion, the contact portion of the storage electrode can be entirely included in the active region. Thus, sufficient distance from the neighboring active region can be secured.

FIG. 7 illustrates the step of forming a storage electrode 13 as a first electrode of the capacitor and of forming a dielectric film 15. After removing second photoresist pattern 5, polycrystalline silicon doped with an impurity is deposited on the entire surface area to form a first conductive layer. This is patterned to provide a storage electrode 13 as the first electrode of the capacitor. Thereafter, dielectric material is coated on the storage electrode 13 to form dielectric film 15 of the capacitor.

FIG. 8 illustrates the step for forming a plate electrode 17 as the second electrode of a capacitor and transistor. A polycrystalline silicon doped with an impurity is deposited on the entire surface area on which dielectric film 15 has been formed, to thereby provide a second conductive layer. This layer is patterned to provide a plate electrode 17 as a second electrode of the capacitor. This completes the capacitor comprised of storage electrode 13, dielectric film 15 and plate electrode 17. Here, reference symbols S1 and S2 represent plate electrode profiles on the active region. This profile is formed by etching the second conductive layer. After completing the capacitor, the gate electrode G, source region 20 and drain region (not shown) are formed by a conventional process to complete the transistor.

In this manufacturing method, patterning the second conductive layer 17 may lead to the profiles S1 or S2 as shown in FIG. 8. If plate electrode 17 has the profile S1, space D occupied by plate electrode 17 will lead to a lack of process margin in manufacturing a highly integrated semiconductor device.

Additionally, if the second conducting layer 17 is excessively etched to form plate electrode 17 having a profile S2, there is a high probability that dielectric film 15 will be exposed to an etchant in the etching step, such that the film may be damaged, which deteriorates the reliability of the memory cell. The same problem will occur in the above AST cell. In a conventional AST cell, such problems are serious since the inter-cell distances are smaller than those of a conventional trench cell.

SUMMARY OF THE INVENTION

Accordingly, the object of the present invention is to provide a semiconductor memory device comprising a capacitor having a second electrode which is self-aligned.

Another object of the present invention is to provide a method of manufacturing a semiconductor memory device wherein the capacitor's second electrode is self-aligned.

To accomplish the above objectives, the present invention provides a semiconductor memory device having a capacitor. The capacitor has a trench formed in a semiconductor substrate. The trench borders a field oxide layer. A first electrode is formed on the inner sidewalls of the trench. A dielectric film covers the first electrode. A second electrode is formed on the dielectric film, the second electrode filling the trench and bordering an impurity doped region.

Additionally, the present invention provides a semiconductor memory device having a transistor formed on an active region of a semiconductor substrate, the transistor comprising a gate electrode and a source and drain region. A field oxide layer defines the active region and is formed in a recessed portion of the semiconductor substrate. A trench is formed in the semiconductor substrate, the trench bordering the field oxide layer and the source region. A leakage current preventing layer is formed on the inner surface of the trench but not on a contact window. A first electrode is formed on the inner sidewalls of the trench, the first electrode being connected to the source region through the contact window. A dielectric film covers the first electrode and the field oxide layer and a second electrode is formed on the dielectric film, the second electrode filling the trench bordering the source region and has a planarized surface.

For accomplishing another object of the present invention, there is provided a method for manufacturing a semiconductor memory device, comprising the steps of: forming an insulating pattern for self-aligning an electrode pattern on an active region of the semiconductor substrate; forming a trench in the semiconductor substrate; depositing a conductive material on the semiconductor substrate having the trench and the insulating pattern to form a conductive layer filling the trench; polishing the conductive layer until the insulating pattern is exposed, to thereby obtain an electrode having a planarized surface; and removing the insulating pattern.

According to another aspect of the present invention, there is provided a method for manufacturing a semiconductor device comprising the steps of: forming a recessed field oxide layer for defining an active region on a semiconductor substrate; forming an insulating pattern for self-aligning an electrode on the active region, the insulating pattern having a step with respect to the field oxide layer; forming a trench in the semiconductor substrate by partially removing the field oxide layer, the insulating pattern and a surface portion of the semiconductor substrate; forming a first electrode on the inner sidewalls of the trench and being electrically connected to an impurity doped region of the semiconductor substrate; coating a dielectric film on the first electrode; forming a second electrode having a planarized surface which fills the trench; and removing the insulating pattern.

According to yet another aspect of the present invention, there is provided a method for manufacturing a semiconductor device comprising the steps of: forming a recessed field oxide layer defining an active region on a semiconductor substrate; forming an insulating pattern for self-aligning an electrode on the active region, the insulating pattern having a step with respect to the field oxide layer; forming a first trench in the semiconductor substrate by partially removing the field oxide layer, the insulating pattern and a surface portion of the semiconductor substrate; forming an anti-oxidative spacer on a portion of an inner surface of the first trench where a contact window is to be formed; forming a second trench in the semiconductor substrate through the first trench, the second trench having a greater depth than the first trench; thermally oxidizing an inner surface portion of the trench using the anti-oxidative spacer as an oxidation mask to thereby obtain a leakage current preventing layer; removing a portion of the anti-oxidative spacer to form the contact window; forming a first electrode on the sidewalls of the trench which is electrically connected to an impurity doped region of the semiconductor substrate through the contact window; coating a dielectric film on the first electrode and the field oxide layer; depositing a conductive material on the dielectric film to thereby form a conductive layer filling the second trench; polishing the conductive layer until a surface of the insulating pattern is exposed to thereby obtain a second electrode having a planarized surface which fills the second trench; removing the insulating pattern; and forming a gate electrode and a source and drain region to form the transistor.

The plate electrode as a second electrode of the capacitor does not unnecessarily occupy space of the active region, and the plate electrode bordering the active region can be formed by self-alignment with the step between the insulating pattern and the field oxide layer.

BRIEF DESCRIPTION OF THE DRAWINGS

These and other objects, features and advantages of the present invention will become more apparent from the following detailed description of the preferred embodiment of the present invention when taken in conjunction with the accompanying drawings, in which.

DESCRIPTION OF THE PREFERRED EMBODIMENT

Hereinafter, the present invention will be explained in detail with reference to the following preferred embodiment.

Figure 1:
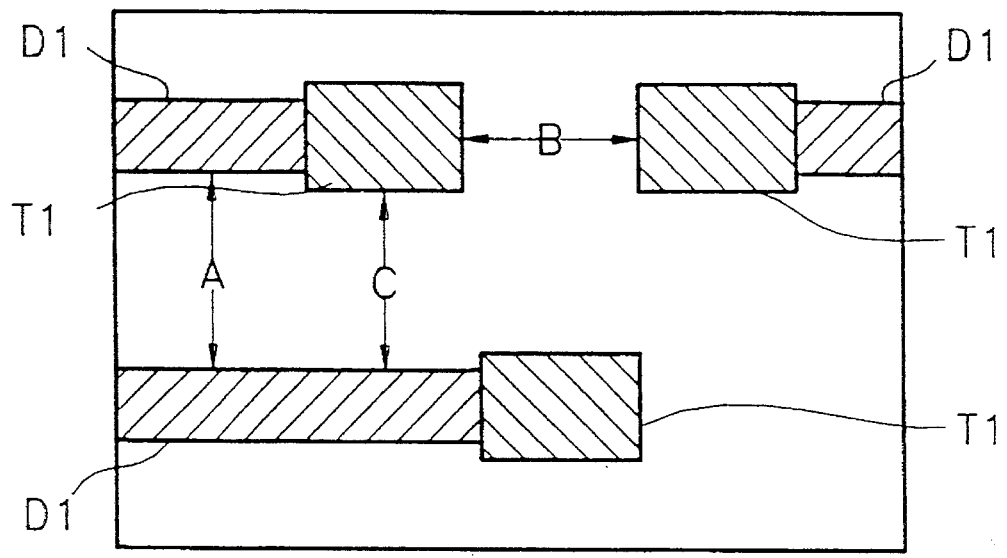
FIG. 1 is a schematic layout showing a conventional trench capacitor cell.
Figure 2:
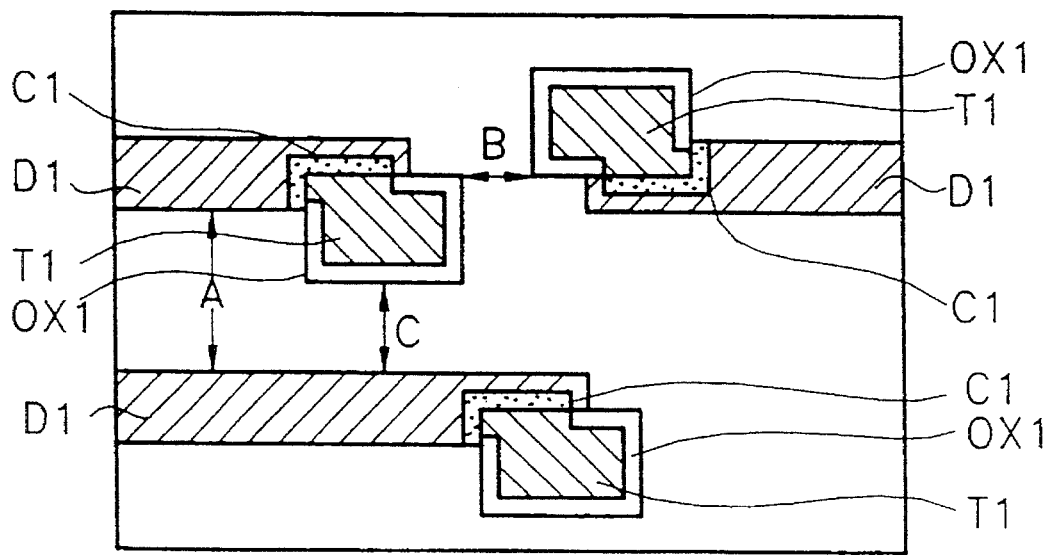
FIG. 2 is a schematic layout showing a conventional AST cell.
Figure 3:
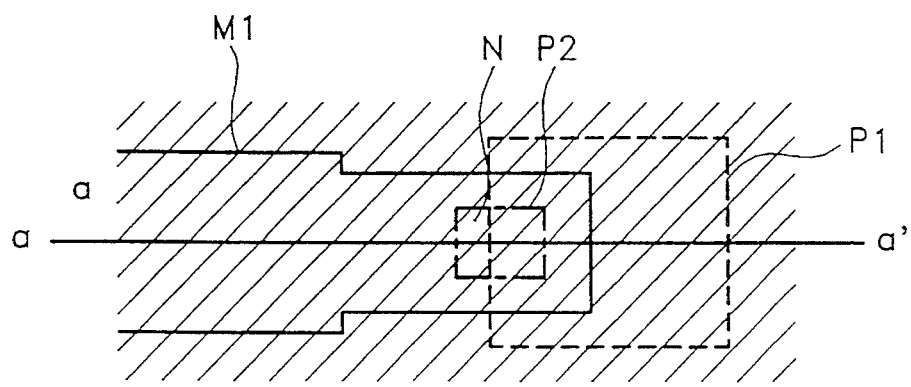
FIG. 3 is a schematic layout showing a conventional method of manufacturing a semiconductor memory device having a trench capacitor cell.
Figure 4:
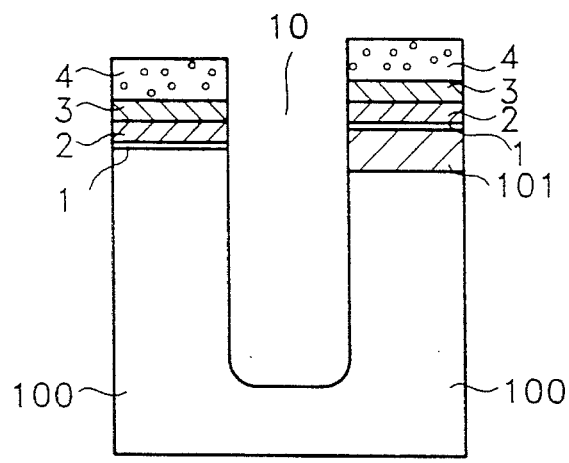
FIGS. 4 to 8 are sectional views showing a conventional method of manufacturing a semiconductor memory device having a trench capacitor cell.
Figure 6:
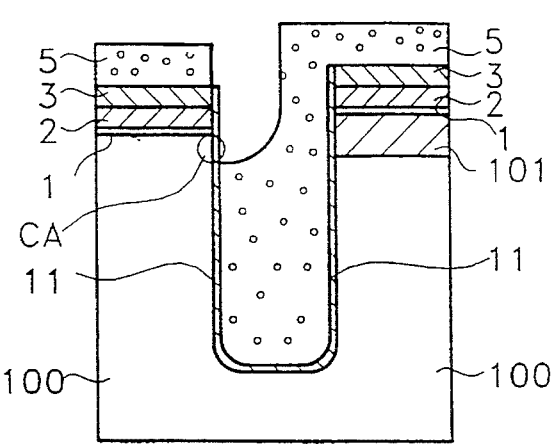
Figure 5:
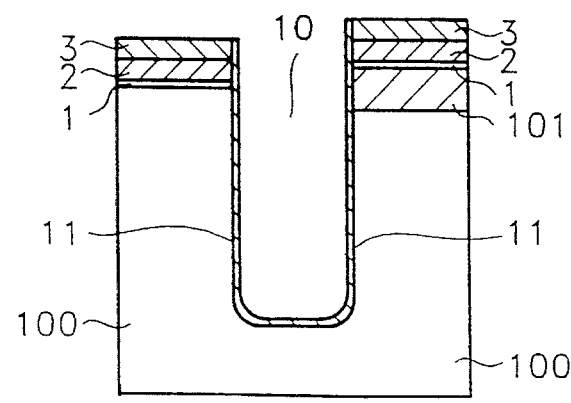
Figure 7:
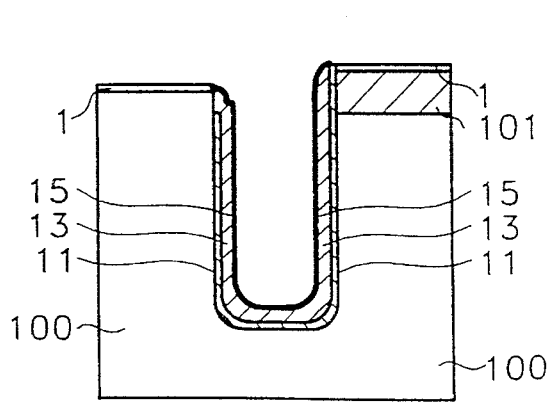
Figure 8:
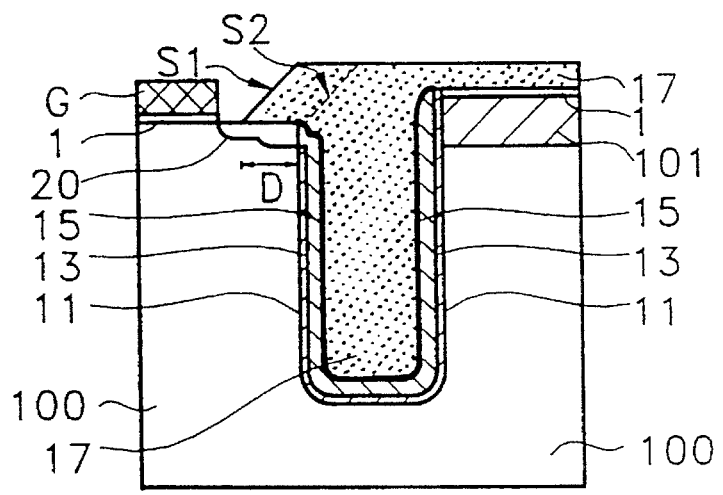
Figure 9:
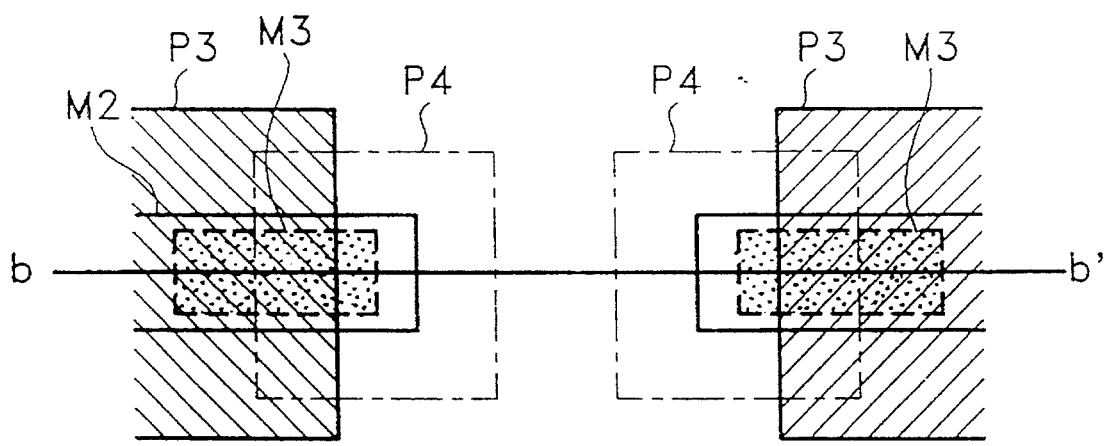
FIG. 9 is a schematic layout for showing a method of manufacturing a semiconductor memory device according to the present invention.

FIG. 9 is a schematic layout showing a method of manufacturing a semiconductor memory device according to one embodiment of the present invention. Here, the portion defined by the solid line M2 is a mask pattern for forming an active region. A portion defined by the dotted rectangular line is a mask pattern M3 for forming an anti-oxidative spacer. The portion defined by a solid line and marked with oblique lines is a mask pattern P3 for forming an insulating pattern for self-aligning a plate electrode, and the portion defined by a dash-dot line P4 is a mask pattern for forming a trench.

FIGS. 10 to FIG. 16 are sectional views for showing an embodiment of a method for manufacturing a semiconductor memory device according to the present invention, taken along line b—b' of the layout of FIG. 9.

Figure 10:
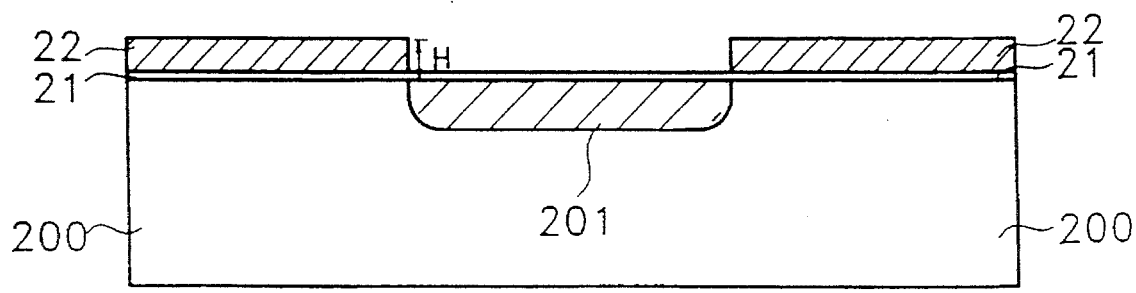
FIGS. 10 to FIG. 16 are sectional views showing a method of manufacturing a semiconductor memory device according to the preferred embodiment of the present invention.

FIG. 10 illustrates the steps of forming a field oxide layer 201 and an insulating pattern 22 for self-aligning a plate electrode. More particularly, a field oxide layer 201 for electrically separating the neighboring active regions is formed on semiconductor substrate 200 of the first conductivity type. Here, in order to form a self-aligned plate electrode as a second electrode of a capacitor, field oxide layer is preferably formed so that more than 70% of the entire field oxide layer grows downward from the surface of semiconductor substrate 200, and has a protruding portion having a thickness less than 1,000Å upward from the surface of semiconductor substrate 200. This field oxide layer 201 may be formed, for example, by forming a recessed portion on semiconductor substrate 200 where a field oxide layer is to be formed and then selectively oxidizing the surface portion in the recessed portion. Thereafter, pad oxide film 21 as a first masking layer, is formed on the whole surface of semiconductor substrate 200 on which field oxide layer 201 has been formed. A second insulating 22 layer which serves as a second masking layer, for example, a silicon nitride ($Si_3N_4$) layer, is formed on pad oxide film 21. Here, it is preferable to form the second insulating layer 22 with a thickness of more than 1,000Å in order to increase the step height H between field oxide layer 201 and the top of the second insulating layer. Then, insulating layer 22 is patterned to form a mask pattern for self-aligning a plate electrode by using mask pattern M3 of FIG. 9.

Figure 11:
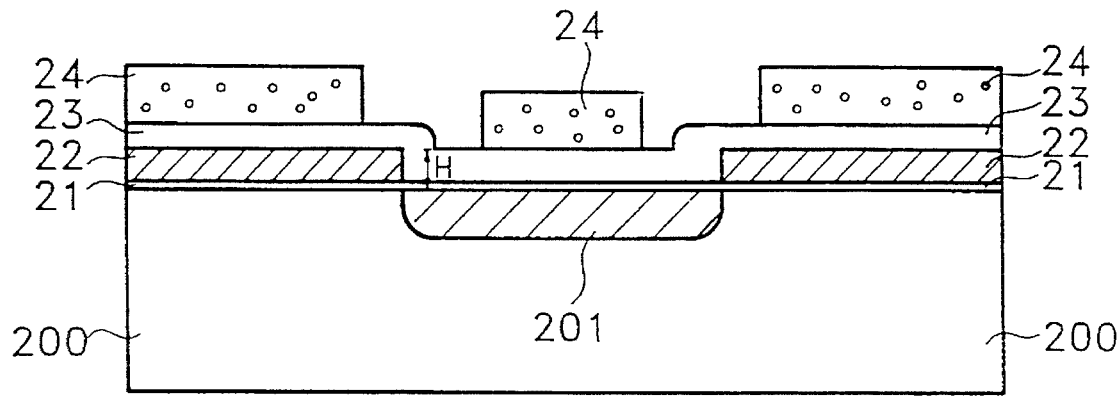

FIG. 11 illustrates the step of forming a third insulating layer 23 and a photoresist pattern 24 for forming a first trench. After the step of FIG. 10, third insulating layer 23 as a third masking layer, for example, a high temperature oxide (HTO) layer, is deposited over the entire surface area, and the photoresist is coated on the third insulating film 23. Then, the photoresist pattern 24 is formed by a light-exposing and developing process using mask pattern P4 for forming a trench as shown in FIG. 9.

Figure 12:
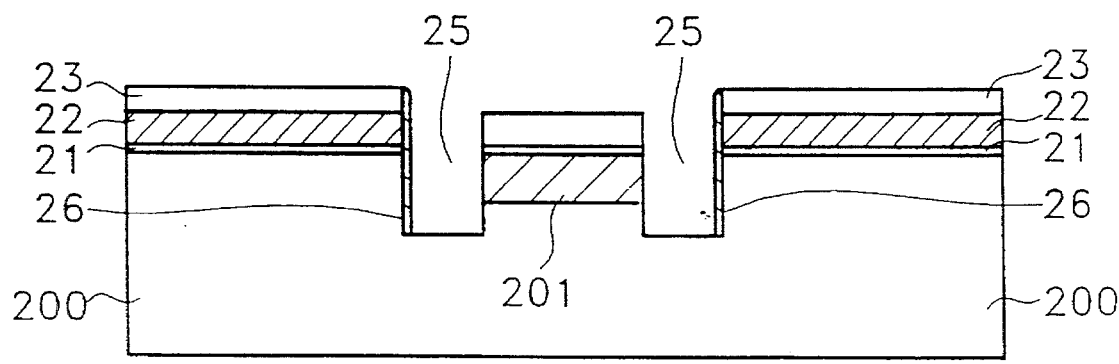

FIG. 12 illustrates a step for forming a first trench 25 and an anti-oxidative spacer 26. More particularly, third insulating layer 23, a portion of insulating pattern 22, pad oxide film 21 and portions of semiconductor substrate 200 and field oxide layer 201 are anisotropically etched by a conventional reactive ion etching (RIE) process using photoresist pattern 24 as an etching mask, to thereby form first trench 25 having a depth of about 5,000Å in semiconductor substrate 200. Thereafter, after removing photoresist pattern 24, an anti-oxidative layer, for example, a silicon nitride ($Si_3N_4$) layer which can prevent the substrate from thermal oxidation, is formed over the entire surface area. Then, the anti-oxidative layer is anisotropically etched to form a spacer on the sidewalls of first trench 25. Thereafter, the spacer is partially removed using mask pattern M3 as shown in FIG. 9, leaving the portion formed where the contact window is to be formed for connecting a source region of a transistor with a first electrode of a capacitor to form anti-oxidative spacer 26. Here, anti-oxidative spacer 26 prevents the contact window portion of the first trench 25 from being oxidized in a subsequent oxidation step.

Figure 13:
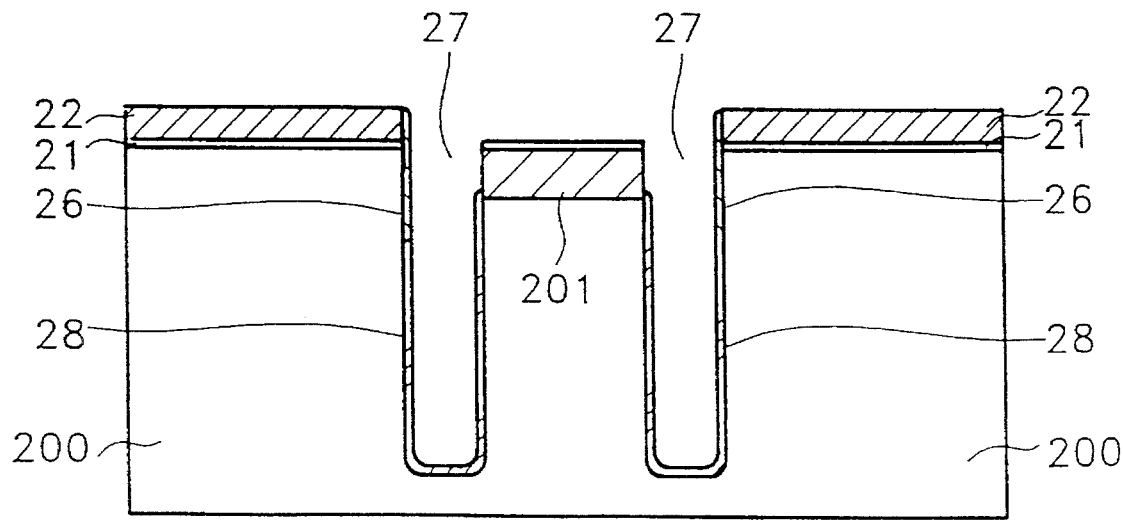

FIG. 13 illustrates the step for forming a second trench 27 and leakage current preventing layer 28. After the step of FIG. 12, second trench 27 which is deeper than first trench 25 having a depth of about 5 μm (50,000Å) is formed by anisotropically etching semiconductor substrate 200 through first trench 25, using third insulating layer 23 as an etching mask. Thereafter, leakage current preventing layer 28 for preventing leakage current between neighboring trenches is formed by thermally oxidizing the inner surface portion of second trench 27.

Figure 14:
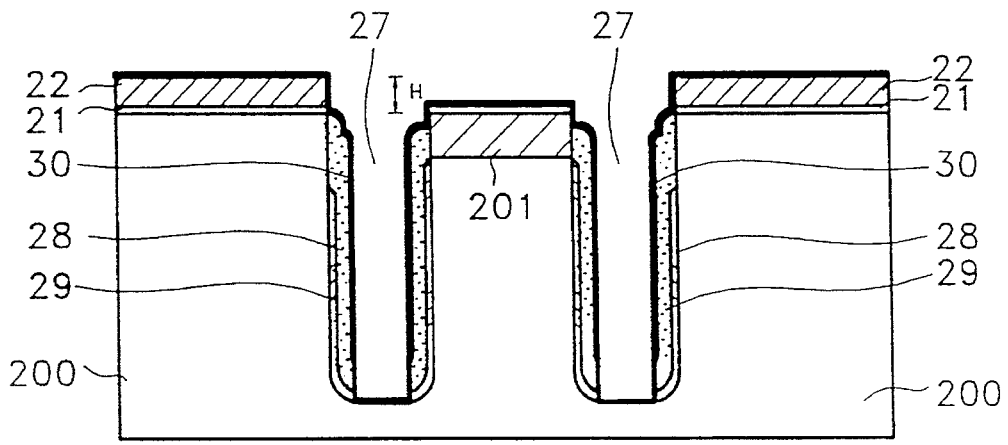

FIG. 14 illustrates the step of forming a storage electrode 29 and a dielectric film 30 of a capacitor. After removing anti-oxidative spacer 26 to thereby expose a portion of the inner surface of second trench 27 where a contact window is to be formed for connecting the source region of a transistor with a first electrode of the capacitor, a conductive material, for example, polycrystalline silicon doped with an impurity, is deposited over the surface area to form a first conductive layer. The first conductive layer is then anisotropically etched to form a self-aligned storage electrode 29 as a first electrode of a capacitor on the sidewalls of second trench 27, which is connected to semiconductor substrate 200 through the contact window. Then, dielectric film 30 is formed over the surface area having storage electrode 29 therebelow. As a dielectric film used in the present embodiment, an oxide/nitride/oxide film (ONO film), an oxide/nitride film (NO film), an oxide film, etc., may be used.

Figure 15:
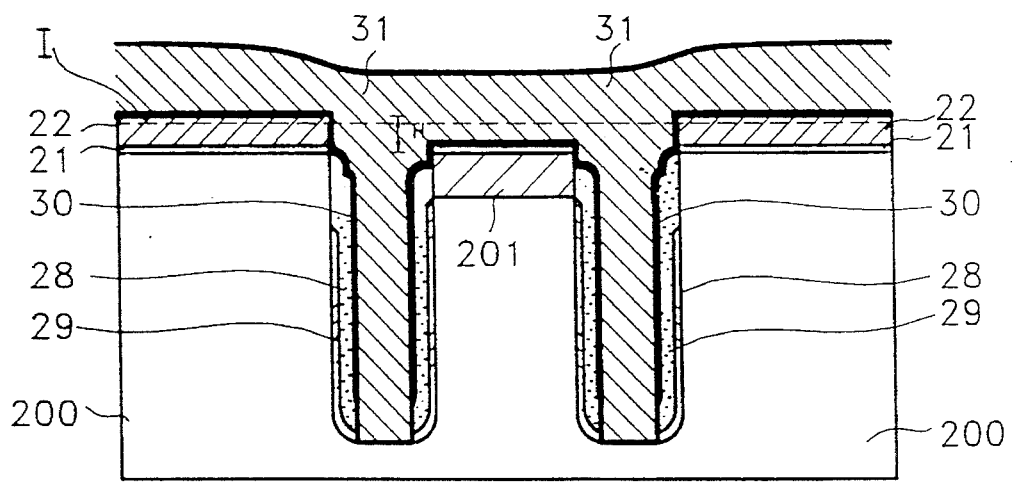

FIG. 15 illustrates the step for forming a plate electrode 31. This step is one of the most important features of the present invention. After the step of FIG. 14, a conductive material, for example, polycrystalline silicon doped with an impurity, is deposited over the surface area to form a second conductive layer 31 completely filling second trench 27. Thereafter, second conductive layer 31 is patterned to form plate electrode 31' as the second electrode of the capacitor via a chemical mechanical polishing (CMP) process. The step H between insulating pattern 22 is used for self-aligning the plate electrode and the field oxide layer 201 formed in the recessed portion. (The CMP process is known to anyone in the pertinent art: see for example, "Silicon Processing for the VLSI Era" by S. Wolf, Vol. 2, 1990, pp. 238–239.) Here, the polishing is continued until the surface of insulating pattern 22 is exposed. Performing this polishing step planarizes the surface of the semiconductor wafer so that plate electrode 31' which fills second trench 27 is formed in the areas adjacent the insulating pattern 22. Also, due to the step H between insulating pattern 22 and field oxide layer 201, field oxide layer 201 is not exposed after the polishing step, and the thus-obtained plate electrode is connected with that of a neighboring cell. Here, symbol I denotes the planarized surface thus-obtained.

Figure 16:
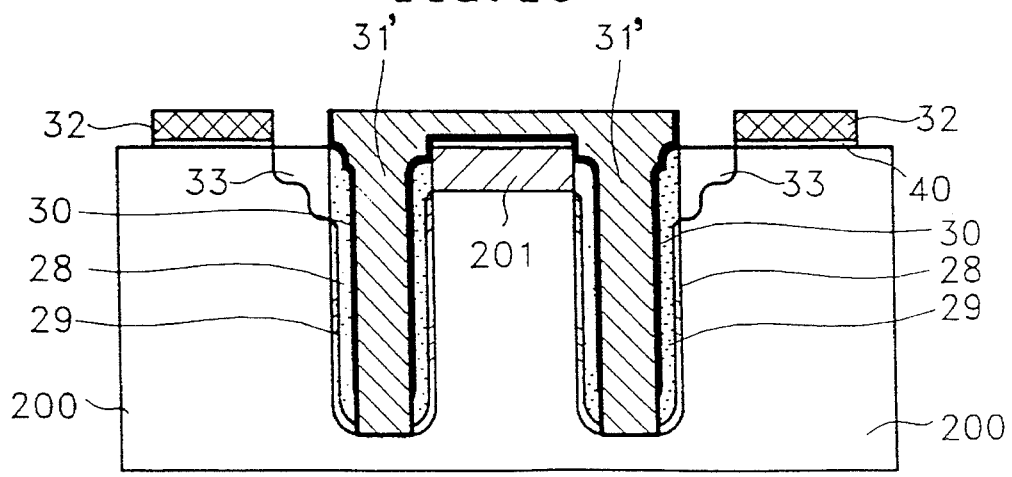

FIG. 16 illustrates a semiconductor device having a capacitor obtained according to the method of the present invention. After the step of FIG. 15, insulating pattern 22 is removed to complete a capacitor comprising a storage electrode 29, a dielectric film 30 and a plate electrode 31' having a planarized surface. Then, a gate electrode 32 isolated from semiconductor substrate 200 by a gate insulating layer 40, and source region 33 and a drain region (not shown) formed in the surface portion of semiconductor substrate 200 in the active region are formed by a conventional method to thereby complete the semiconductor device. As can be seen from FIG. 15, since plate electrode 31' occupies the space over source region 33 for patterning the second electrode of the capacitor, a process margin can be easily secured.

As shown in FIG. 16, the semiconductor device of the present invention comprises a field oxide layer 201 which defines an active region, a gate electrode 32, a source region 33 and drain region (not shown) which are formed in the active region, a trench 27 bordering field oxide layer 201, a leakage current preventing layer 28 formed on the inner surface of trench 27 but not on a contact window exposing source region 33 to trench 27, a storage electrode 29 formed on the sidewalls of trench 27 which is electrically connected to the source region 33 through the contact window, a dielectric film 30 covering storage electrode 29 and field oxide layer 201, and a plate electrode 31' formed on dielectric film 30 and filling trench 27. Plate electrode 31' has a planarized surface and is formed so that a vertical side wall thereof exists directly over the outer sidewalls of trench 27 and so as to border source region 33.

According to the present invention, the plate electrode does not occupy the space of the active region. Therefore, a sufficient process margin in the subsequent steps is secured so that manufacturing a highly integrated DRAM having an AST cell can be realized. Also, since the plate electrode bordering the active region is formed by self-alignment using the step between an insulating pattern and the field oxide layer formed in a recessed portion of a semiconductor substrate, damage to the dielectric film during the etching step of a second conductive layer for forming the plate electrode may be prevented. Thus, a reliable semiconductor memory device is secured.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A method for manufacturing a trench capacitor in a semiconductor device, comprising the steps of:

forming a recessed field oxide layer in a surface region of a semiconductor substrate;

forming a first insulating layer on a major surface of said semiconductor substrate and an upper surface of said recessed field oxide layer;

forming an opening in said first insulating layer to expose said upper surface of said recessed field oxide layer, wherein there exists a height difference between an upper surface of said first insulating layer and said upper surface of said recessed field oxide layer;

forming a second insulating layer on said first insulating layer and said upper surface of said recessed field oxide layer;

forming a trench in said semiconductor substrate by selectively removing a portion of said second insulating layer disposed above a first portion of said recessed field oxide layer and on a marginal edge portion of said second insulating layer adjacent to said recessed field oxide layer, and underlying portions of said first insulating layer, said recessed field oxide layer, and said semiconductor substrate, said trench being adjacent to a remaining, second portion of said recessed field oxide layer and having a first depth;

removing remaining portions of said second insulating layer, to thereby expose an upper surface of said second portion of said recessed field oxide layer;

forming a spacer on an outer sidewall of said trench spaced-apart from said second portion of said recessed field oxide layer;

removing a portion of said semiconductor substrate beneath a bottom surface of said trench, to thereby extend said trench to a second depth greater than said first depth;

forming a leakage current prevention layer on exposed portions of sidewalls and said bottom surface of said trench;

removing said spacer, to thereby expose a contact window portion of said trench;

forming a first conductive layer on said leakage current prevention layer and said exposed contact window portion of said trench;

forming a dielectric film on said first conductive layer, said exposed upper surface of said second portion of said recessed field oxide layer, and said first insulating layer;

forming a second conductive layer on said dielectric film, to completely fill said trench;

removing portions of said second conductive layer and said dielectric film disposed on underlying portions of said first insulating layer, wherein a remaining portion of said second conductive layer disposed above said trench has an exposed surface which is planar, due to said height difference; and, removing said underlying portions of said first insulating layer, to thereby complete the formation of a trench capacitor including said first conductive layer as a first electrode, said dielectric film, and said second conductive layer as a second electrode.

2. The method as set forth in claim 1, wherein said second electrode is vertically aligned with said outer sidewall of said trench.

3. The method as set forth in claim 1, wherein said upper surface of said recessed field oxide layer is planar.

4. The method as set forth in claim 1, wherein more than 70% of said recessed field oxide layer is disposed beneath a plane which includes said major surface of said semiconductor substrate.

5. The method as set forth in claim 4, wherein less than 100% of said recessed field oxide layer is disposed beneath said plane.

6. The method as set forth in claim 4, wherein said upper surface of said recessed field oxide layer is planar.

7. The method as set forth in claim 1, wherein said forming a trench step is performed using an anisotropic etching process.

8. The method as set forth in claim 1, wherein said forming a leakage current prevention layer step is performed using a thermal oxidation process.

9. The method as set forth in claim 1, further comprising, prior to said step of removing said underlying portions of said first insulating layer, the step of chemically mechanically polishing said second conductive layer until said first insulating layer is exposed, whereby an entire upper surface of said second conductive layer is planarized.

10. The method as set forth in claim 9, wherein said step of removing said underlying portions of said first insulating layer is performed by etching said second conductive layer, subsequent to said chemically polishing step, so that said second electrode produced thereby has vertical edges which are self-aligned with said outer sidewall of said trench.

11. The method as set forth in claim 1, further comprising the step of forming an opening in said first electrode and said leakage current prevention layer prior to performing said forming a dielectric layer step, whereby said dielectric layer is disposed in contact with a portion of said semiconductor substrate disposed beneath said bottom surface of said trench.

12. A method for manufacturing a trench capacitor, comprising the steps of:

forming a recessed field oxide layer in a surface region of a semiconductor substrate;

forming a trench in said semiconductor substrate adjacent to said recessed field oxide layer, said trench having a first depth;

forming a spacer on an outer sidewall of said trench spaced-apart from said recessed field oxide layer;

removing a portion of said semiconductor substrate beneath a bottom surface of said trench, to thereby extend said trench to a second depth greater than said first depth;

forming a leakage current prevention layer on exposed portions of sidewalls and said bottom surface of said trench;

removing said spacer, to thereby expose a contact window portion of said trench;

forming a first conductive layer on said leakage current prevention layer and said exposed contact window portion of said trench;

forming a dielectric film on said first conductive layer; and, forming a second conductive layer on said dielectric film, to completely fill said trench.

13. The method as set forth in claim 12, wherein an upper surface of said recessed field oxide layer is planar.

14. The method as set forth in claim 12, further comprising the step of planarizing an upper surface of said second conductive layer by chemically mechanically polishing said upper surface of said second conductive layer.

15. The method as set forth in claim 14, further comprising the step of etching said second conductive layer, subsequent to said planarizing step, so that vertical edges of said second conductive layer are vertically aligned with said outer sidewall of said trench.

16. The method as set forth in claim 12, wherein more than 70% of said recessed field oxide layer is disposed beneath a plane which includes a major surface of said semiconductor substrate adjacent to said recessed field oxide layer.

17. The method as set forth in claim 12, wherein said forming a trench step is performed using an anisotropic etching process.

18. The method as set forth in claim 12, wherein said forming a leakage current prevention layer step is performed using a thermal oxidation process.

19. The method as set forth in claim 12, wherein said spacer is made of an anti-oxidative material.

20. The method as set forth in claim 12, further comprising the step of forming an impurity diffusion region in said semiconductor substrate adjacent to and in contact with said contact window portion of said trench.

21. The method as set forth in claim 12, further comprising the step of forming an opening in said first conductive layer and said leakage current prevention layer, prior to performing said forming a dielectrice layer step, whereby said dielectric layer is disposed in contact with a portion of said semiconductor substrate disposed beneath said bottom surface of said trench.

22. A method for manufacturing a trench capacitor, comprising the steps of:

forming a recessed field oxide layer in a surface region of a semiconductor substrate;

forming a first trench in said semiconductor substrate adjacent to a first side of said field oxide layer, and a second trench in said semiconductor substrate adjacent to a second side of said field oxide layer opposite said first side, said first and second trenches having a first depth;

forming a first spacer on an outer sidewall of said first trench spaced-apart from said first side of said recessed field oxide layer, and a second spacer on an outer sidewall of said second trench spaced-apart from said second side of said recessed field oxide layer;

removing a portion of said semiconductor substrate beneath a bottom surface of said first trench, to thereby extend said first trench to a second depth greater than said first depth, and removing a portion of said semiconductor substrate beneath a bottom surface of said second trench, to thereby extend said second trench to said second depth;

forming a first leakage current prevention layer on exposed portions of sidewalls and said bottom surface of said first trench, and forming a second leakage current prevention layer on exposed portions of sidewalls and said bottom surface of said second trench;

removing said first and second spacers, to thereby expose a contact window portion of said first and second trenches;

forming a first electrode of a first trench capacitor on said first leakage current prevention layer and said exposed contact window portion of said first trench, and forming a first electrode of a second trench capacitor on said second current prevention leakage layer and said exposed contact window portion of said second trench;

forming a dielectric film on said first and second electrodes, and over an upper surface of said recessed field oxide layer which bridges said first and second trenches; and, forming a second conductive layer on said dielectric film, to completely fill said first and second trenches, said second conductive layer serving as a second electrode of both of said first and second trench capacitors.

23. The method as set forth in claim 22, wherein said upper surface of said recessed field oxide layer is planar.

24. The method as set forth in claim 22, further comprising the step of planarizing an upper surface of said second conductive layer by chemically mechanically polishing said upper surface of said second conductive layer.

25. The method as set forth in claim 24, further comprising the step of etching said second conductive layer, subsequent to performing said planarizing step, so that vertical edges of said second electrode are aligned with said outer sidewalls of said first and second trenches, respectively.

26. The method as set forth in claim 22, further comprising the step of forming a first impurity diffusion region in said semiconductor substrate adjacent to and in contact with said contact window portion of said first trench, and forming a second impurity diffusion region in said semiconductor substrate adjacent to and in contact with said contact window portion of said second trench.

27. The method as set forth in claim 22, wherein said first and second spacers are each made of an anti-oxidative material.

28. The method as set forth in claim 22, wherein said first and second leakage current prevention layer forming step is performed using a thermal oxidation process.

29. The method as set forth in claim 22, wherein said step of forming first and second trenches is performed using an anisotropic etching process.

* * * * *